(12) United States Patent
Tu et al.

(10) Patent No.: US 12,495,643 B2
(45) Date of Patent: Dec. 9, 2025

(54) ELECTRONIC DEVICE COMPRISING STACKED LAYERS AND GROOVES

(71) Applicant: Innolux Corporation, Miao-Li County (TW)

(72) Inventors: Cheng-Yu Tu, Miao-Li County (TW); Pai-Chi Tsai, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 626 days.

(21) Appl. No.: 17/742,398

(22) Filed: May 12, 2022

(65) Prior Publication Data

US 2022/0393066 A1 Dec. 8, 2022

Related U.S. Application Data

(60) Provisional application No. 63/196,686, filed on Jun. 4, 2021.

(30) Foreign Application Priority Data

Jan. 24, 2022 (CN) .......................... 202210080746.2

(51) Int. Cl.
H10H 20/819 (2025.01)
(52) U.S. Cl.
CPC ................................ *H10H 20/819* (2025.01)
(58) Field of Classification Search
CPC ......... H01L 33/20; H01L 25/167; B32B 3/08; B32B 7/12; H10H 20/819
See application file for complete search history.

(56) References Cited

U.S. PATENT DOCUMENTS

| | | | | |
|---|---|---|---|---|
| 10,037,981 | B2* | 7/2018 | Banna | H01L 25/0753 |
| 11,349,052 | B2* | 5/2022 | Morris | H10H 20/855 |
| 2008/0074583 | A1* | 3/2008 | Li | G02F 1/133617 349/71 |
| 2010/0182351 | A1* | 7/2010 | Lin | G02F 1/133504 345/690 |

(Continued)

FOREIGN PATENT DOCUMENTS

| | | |
|---|---|---|
| CN | 203212519 | 9/2013 |
| CN | 105892736 | 8/2016 |

(Continued)

OTHER PUBLICATIONS

"Office Action of Taiwan Counterpart Application", issued on Jan. 12, 2023, p. 1-p. 9.

(Continued)

*Primary Examiner* — Bitew A Dinke
(74) *Attorney, Agent, or Firm* — JCIPRNET

(57) ABSTRACT

An electronic device is provided. The electronic device includes a support substrate, a first substrate, a semiconductor element, and an adhesive layer. The first substrate is disposed on the support substrate. The semiconductor element is disposed on the first substrate. The adhesive layer is disposed between the support substrate and the first substrate. The adhesive layer includes a plurality of grooves. The electronic device provided by the disclosure is capable of improving the appearance flatness problem caused by air bubbles between the adhesive layer and other stacked layers through the grooves of the adhesive layer.

19 Claims, 6 Drawing Sheets

(56) References Cited

U.S. PATENT DOCUMENTS

| | | | |
|---|---|---|---|
| 2015/0362165 A1* | 12/2015 | Chu | H10H 20/825 |
| | | | 362/235 |
| 2016/0216821 A1* | 7/2016 | Lee | G06F 3/041 |
| 2018/0210280 A1* | 7/2018 | Chen | G02F 1/1343 |
| 2019/0019449 A1* | 1/2019 | Pappas | G09G 3/32 |
| 2019/0066571 A1* | 2/2019 | Goward | G09G 3/3233 |
| 2019/0355702 A1* | 11/2019 | Herner | H10D 84/83 |
| 2019/0355874 A1* | 11/2019 | Herner | H10D 86/441 |
| 2020/0403028 A1* | 12/2020 | Kusunoki | H10H 20/851 |
| 2021/0063802 A1* | 3/2021 | Huang | G02F 1/13452 |
| 2021/0107251 A1* | 4/2021 | Chen | B32B 7/022 |
| 2022/0285428 A1* | 9/2022 | Jo | H10H 20/851 |
| 2022/0406981 A1* | 12/2022 | Yamazaki | H10H 20/857 |
| 2023/0060303 A1* | 3/2023 | Yamazaki | H10H 20/8512 |

FOREIGN PATENT DOCUMENTS

| | | | | |
|---|---|---|---|---|
| CN | 109254679 | | 1/2019 | |
| CN | 109904189 | | 6/2019 | |
| CN | 112445015 A | | 3/2021 | |
| KR | 20200014599 A | * | 2/2020 | H01L 27/30 |
| TW | 201205901 | | 2/2012 | |
| TW | 201411663 | | 3/2014 | |

OTHER PUBLICATIONS

"Office Action of China Counterpart Application", issued on Apr. 15, 2025, p. 1-p. 8.
"Office Action of China counterpart Application", issued on Sep. 16, 2025, p. 1-p. 8.

\* cited by examiner

ELECTRONIC DEVICE COMPRISING STACKED LAYERS AND GROOVES

CROSS-REFERENCE TO RELATED APPLICATION

This application claims the priority benefit of U.S. application Ser. No. 63/196,686, filed on Jun. 4, 2021, and China application serial no. 202210080746.2, filed on Jan. 24, 2022. The entirety of each of the above-mentioned patent applications is hereby incorporated by reference herein and made a part of this specification.

BACKGROUND

Technical Field

The disclosure relates to an electronic device, and in particular, relates to an electronic device that may improve the appearance flatness problem caused by air bubbles between the adhesive layer and other stacked layers through the grooves of the adhesive layer.

Description of Related Art

Electronic devices or splicing electronic devices have been widely applied in different fields such as communication, display, vehicle, or aviation. With the vigorous advancement of electronic devices, the development of the electronic devices moves towards thinness and lightness. Therefore, the requirements for reliability, quality, and flatness of the overall appearance of the electronic devices continue to grow.

SUMMARY

The disclosure provides an electronic device capable of improving the appearance flatness problem caused by air bubbles between an adhesive layer and other stacked layers through grooves of the adhesive layer.

According to an embodiment of the disclosure, an electronic device includes a support substrate, a first substrate, a semiconductor element, and an adhesive layer. The first substrate is disposed on the support substrate. The semiconductor element is disposed on the first substrate. The adhesive layer is disposed between the support substrate and the first substrate. The adhesive layer includes a plurality of grooves.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
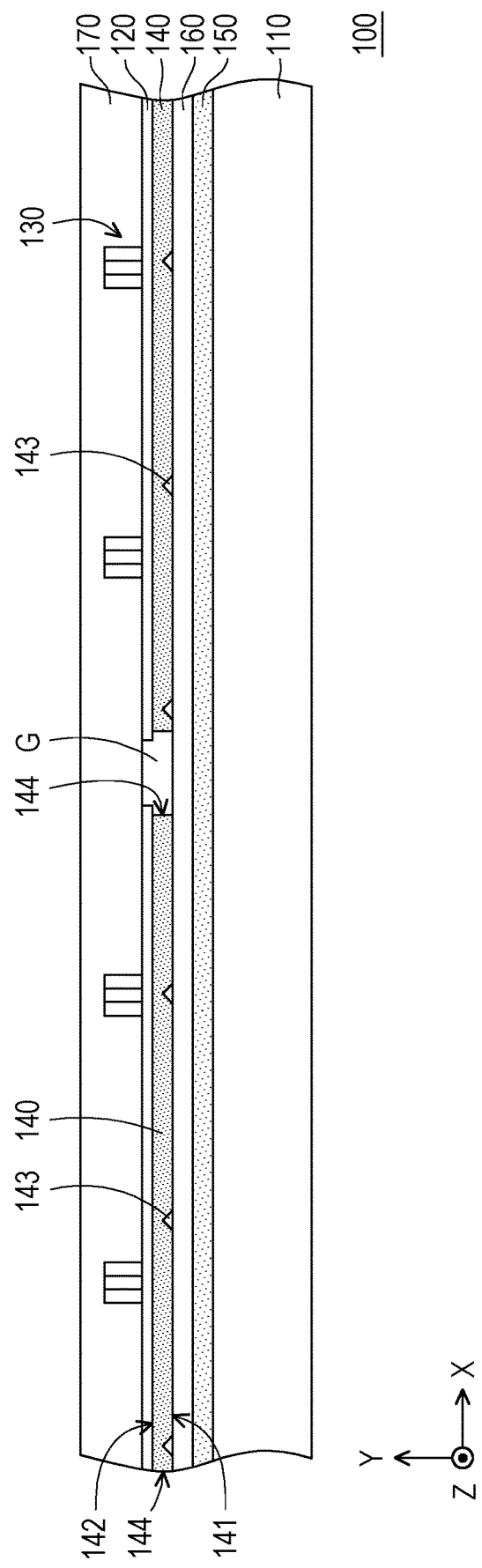
FIG. 1A is a local cross-sectional schematic view of an electronic device according to an embodiment of the disclosure.

The accompanying drawings are included together with the detailed description provided below to provide a further understanding of the disclosure. Note that in order to make the accompanying drawings to be more comprehensible to readers and for the sake of clarity of the accompanying drawings, only part of the electronic device is depicted in the accompanying drawings of the disclosure, and specific elements in the drawings are not depicted according to actual scales. In addition, the numbers and sizes of the elements in each drawing are provided for illustration only and are not used to limit the scope of the disclosure.

In the following specification and claims, the words "containing" and "including" are open-ended words and therefore should be interpreted as "containing but not limited to . . . ".

It should be understood that when an element or a film layer is referred to as being "on" or "connected to" another element or film layer, it can be directly on the another element or film layer or be directly connected to the another element or film layer, or an inserted element or film layer may be provided therebetween (not a direct connection). In contrast, when the element is referred to as being "directly on" another element or film layer or "directly connected to" another element or film layer, an inserted element or film layer is not provided therebetween.

Although the terms "first", "second", "third" . . . may be used to describe various elements, the elements are not limited to these terms. These terms are only used to distinguish a single element from other elements in the specification. The same terms may not be used in the claims, and the elements in the claims may be replaced with first, second, third . . . according to the order declared by the elements in the claims. Therefore, in the following description, the first element may be the second element in the claims.

In the text, the terms "about", "approximately", "substantially", "roughly" generally mean a range within 10%, 5%, 3%, 2%, 1%, or 0.5% of a given value. The number given here is an approximate number, that is, the meanings of "about", "approximately", "substantially", and "roughly" may still be implied without specifying "about", "approximately", "substantially", and "roughly".

In some embodiments of the disclosure, regarding the words such as "connected", "interconnected", etc. referring to bonding and connection, unless specifically defined, these words mean that two structures are in direct contact or two structures are not in direct contact, and other structures are provided to be disposed between the two structures. The word for joining and connecting may also include the case where both structures are movable or both structures are fixed. In addition, the word "coupled" may include any direct or indirect electrical connection means.

In some embodiments of the disclosure, an optical microscopy (OM), a scanning electron microscope (SEM), a film thickness profile measuring instrument (α-step), an elliptical thickness measuring instrument, or other suitable methods may be adopted to measure an area, a width, a thickness, or a height of each element or to measure a distance or spacing between elements. In detail, according to some embodiments, the scanning electron microscope may be used to obtain a cross-sectional structural image of an element to be measured, and to measure the area, width, thickness, or height of each element, or the distance or spacing between the elements.

The electronic device of the disclosure may include a display device, a backlight device, an antenna device, a sensing device, or a splicing device, but not limited thereto. The electronic device may be a bendable or flexible electronic device. The display device may be a non-self-luminous display device or a self-luminous display device. The antenna device may be a liquid crystal antenna device or a non-liquid crystal antenna device, and the sensing device may be a sensing device that senses capacitance, light, heat, or ultrasound, but not limited thereto. The semiconductor element included in the electronic device may include a passive element and an active element, such as a capacitor, a resistor, an inductor, a diode, and a transistor. The diode may include a light emitting diode (LED) or a photodiode. The light emitting diode may include but not limited to an organic LED (OLED), a sub-millimeter LED (mini LED), a micro LED, or a quantum dot LED. The splicing device may be, for example, a display splicing device or an antenna splicing device, but is not limited thereto. Note that the electronic device may be any combination of the foregoing, but is not limited thereto. Hereinafter, the disclosure is described with an electronic device.

It should be understood that in the following embodiments, the features of several different embodiments may be replaced, recombined, and mixed to complete other embodiments without departing from the spirit of the disclosure. As long as the features of the embodiments do not violate or do not conflict with the spirit of the disclosure, they may be mixed and matched arbitrarily.

Descriptions of the disclosure are given with reference to the exemplary embodiments illustrated by the accompanying drawings. Wherever possible, the same reference numbers are used in the drawings and the description to refer to the same or like parts.

Figure 1C:
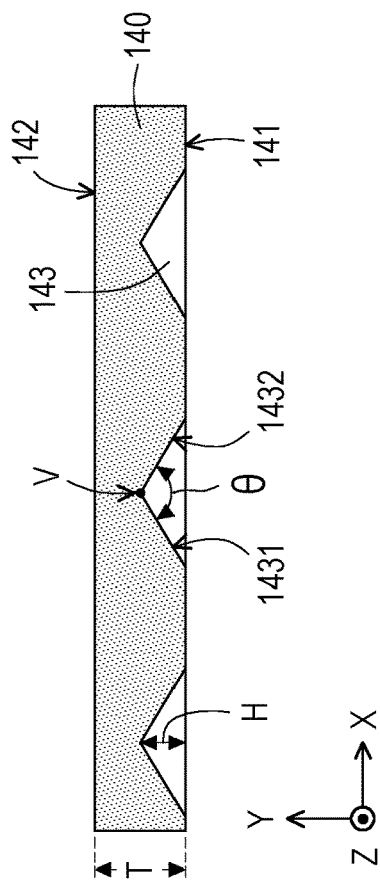
FIG. 1C is a local enlargement view of the adhesive layer of the electronic device of FIG. 1A.
Figure 1B:
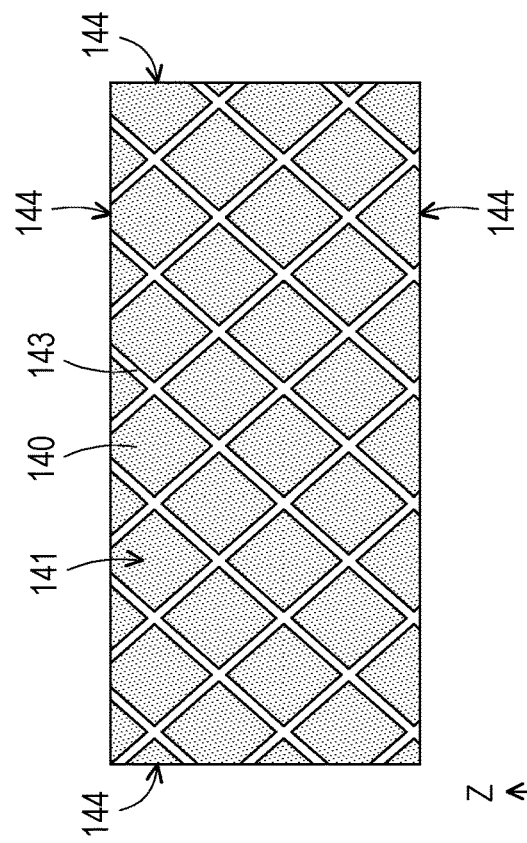
FIG. 1B is a bottom schematic view of an adhesive layer of the electronic device of FIG. 1A.

FIG. 1A is a local cross-sectional schematic view of an electronic device according to an embodiment of the disclosure. FIG. 1B is a bottom schematic view of an adhesive layer of the electronic device of FIG. 1A. FIG. 1C is a local enlargement view of the adhesive layer of the electronic device of FIG. 1A.

With reference to FIG. 1A, an electronic device 100 provided by this embodiment includes a support substrate 110, a first substrate 120, a semiconductor element 130, and an adhesive layer 140. Herein, the support substrate 100 may be a rigid substrate, a flexible substrate, or a combination of the foregoing. For instance, a material of the support substrate 110 may include glass, quartz, sapphire, a silicon wafer, a silicon carbide wafer, ceramics, polycarbonate (PC), polymethylmethacrylate, siloxane, polyimide (PI), polyethylene terephthalate (PET), other suitable substrate materials, or a combination of the foregoing, but it is not limited thereto. Besides, in this embodiment, the electronic device 100 further includes an adhesive layer 150 located on the support substrate 110, a driving substrate 160 located between the first substrate 120 and the support substrate 110, and a protection layer 170 located on the first substrate 120 and located on the same side of the first substrate 120 as the semiconductor element 130.

In this embodiment, a direction X, a direction Y, and a direction Z are different directions. The direction X is, for example, an extending direction of the support substrate 110, and the direction Y is, for example, a normal direction of the support substrate 110. The direction X is substantially perpendicular to the direction Y, and the directions X and Y are each substantially perpendicular to the direction Z, but it is not limited thereto.

To be specific, the adhesive layer 150 is disposed on the support substrate 110 and is disposed between the support substrate 110 and the first substrate 120, for example, the adhesive layer 150 is located between the support substrate 110 and the driving substrate 160. In this embodiment, the adhesive layer 150 may be attached to the support substrate 110 by, for example, air lamination or vacuum lamination. A material of the adhesive layer 150 may be, for example, an optically clear adhesive (OCA), optical clear resin (OCR), a pressure sensitive adhesive (PSA), other suitable adhesive materials, or a combination of the foregoing, but it is not limited thereto. A Young's modulus of the adhesive layer 150 may be, for example, 0.001 MPa to 500 MPa (0.001 MPa≤Young's modulus≤500 MPa), but it is not limited thereto.

The driving substrate 160 is disposed on the adhesive layer 150. The driving substrate 160 may be an active driving substrate or a passive driving substrate. For instance, the driving substrate 160 may include a driving circuit (not shown) formed by scan lines, data lines, and/or transistors, but it is not limited thereto. The driving substrate 160 may be coupled to the first substrate 120, and the driving substrate 160 may drive the semiconductor element 130 through the first substrate 120. In this embodiment, the driving substrate 160 may be, for example, a rigid substrate, a flexible substrate, or a combination of the foregoing. For instance, a material of the driving substrate 160 may include glass, quartz, sapphire, a silicon wafer, a silicon carbide wafer, ceramics, polycarbonate, polymethylmethacrylate, siloxane, polyimid, polyethylene terephthalate, other suitable substrate materials, or a combination of the foregoing, but it is not limited thereto. In some embodiments, the driving substrate 160 may be bendable.

A plurality of adhesive layers 140 (2 are schematically shown in FIG. 1A as an example, but it is not limited thereto) are disposed on the driving substrate 160, and a gap G is provided between two adjacent adhesive layers 140. The adhesive layers 140 are disposed between the support substrate 110 and the first substrate 120. The adhesive layers 140 may be located between the driving substrate 160 and the first substrate 120. The adhesive layers 140 may be attached to the driving substrate 160 by, for example, air lamination or vacuum lamination. The material of the adhesive layers 140 may be, for example, an optically clear adhesive, optical clear resin, a pressure sensitive adhesive, other suitable adhesive materials, or a combination of the foregoing, but it is not limited thereto. The Young's modulus of the adhesive layers 140 is, for example, 0.001 MPa to 500 MPa (0.001 MPa≤Young's modulus≤500 MPa), but it is not limited thereto.

To be specific, each of the adhesive layers 140 has a first side 141 and a second side 142 opposite to each other. The first side 141 is the side of the adhesive layer 140 facing the support substrate 110 and is the side of the adhesive layer 140 facing the driving substrate 160. The second side 142 is the side of the adhesive layer 140 facing the semiconductor element 130 and is the side of the adhesive layer 140 facing the first substrate 120. In this embodiment, each of the adhesive layers 140 includes a plurality of grooves 143. Herein, the grooves 143 are located at the side (i.e., the first side 141) of the adhesive layer 140 facing the support substrate 110, so that the first side 141 of the adhesive layer 140 is nonplanar, but it is not limited thereto. The grooves 143 do not disconnect the adhesive layer 140, and the grooves 143 do not connect the first side 141 and the second side 142.

With reference to FIG. 1B, in the bottom schematic view of the adhesive layer 140, the grooves 143 may extend to four edges 144 of the adhesive layer 140 in one or more directions, and a shape design of the grooves 143 and arrangement of the grooves 140 may generate fixed lines or repetitive patterns. For instance, as shown in FIG. 1B, a plurality of elongated grooves 143 may be arranged in an alternating manner to form rhombus patterns on a surface of the adhesive layer 140 at the first side 141, but the disclosure is not limited thereto. For instance, in the embodiments shown in FIG. 2 and FIG. 3, the grooves may also be rhombus or other shapes, and the adhesive layer located at the first side may also be circular, hexagonal, or other shapes, as long as the grooves are repeatable shapes per unit area and the grooves may extend to the edges of the adhesive layer.

Since air bubbles may be easily generated when the substrates are attached, in this embodiment, the grooves 143 may be treated as exhaust channels to provide the function of exhaust. In this way, the air bubbles between the adhesive layer 140 and the driving substrate 160 may be discharged towards the edges 144 of the adhesive layer 140 through and along the grooves 143 (i.e., exhaust channels), and the problem of poor electrical connection between the first substrate 120 and the driving substrate 160 due to air bubbles may thus be improved. Herein, the air bubbles are generated, for example, when the adhesive layer 140 is attached to the driving substrate 160 or are generated during other post-processes (e.g., high temperature) after the adhesive layer 140 is attached to the driving substrate 160, but it is not limited thereto.

With reference to FIG. 1C, in the local cross-sectional schematic view of the adhesive layer 140, a thickness T of the adhesive layer 140 may be, for example, 10 µm to 50 µm (10 µm≤thickness of the adhesive layer≤50 µm), so that the first substrate 120 may be electrically connected to the driving substrate 160 by solder (not shown) penetrating the adhesive layer 140, but it is not limited thereto. In some embodiments, a height H of each of the grooves 143 may be, for example, in a range of 3 µm to half the thickness T of the adhesive layer 140 (3 µm≤groove height≤½T), on the premise of taking into account the groove exhaust capability and the structural integrity of the adhesive layer 140. For instance, when the thickness T of the adhesive layer 140 is 50 µm, the height H of each of the grooves 143 may be in the range of 3 µm to 25 µm (3 µm≤groove height≤25 µm). That is, the height H of each of the grooves 143 is required to be at least 3 µm, so that the air bubbles may be discharged through the of grooves 143. When the thickness T of the adhesive layer 140 is 50 µm, the height H of each of the grooves 143 should not exceed 25 µm, so as not to damage the structural integrity of the adhesive layer 140, which may lead to the risk of disconnection of the adhesive layer 140 when it is separated from a release layer (not shown). In some embodiments, the height H of each of the grooves 143 may be ⅓ to ½ of the thickness T of the adhesive layer 140 (i.e., ⅓×T≤H≤½×T), but the disclosure is not limited thereto. Herein, the thickness T is, for example, a maximum thickness of the adhesive layer 140 measured in the normal direction of the support substrate 110 (i.e., the direction Y). The height H is, for example, a maximum height of each of the grooves 143 measured in the normal direction of the support substrate 110 (i.e., the direction Y). Besides, in this embodiment, in the bottom schematic view of the adhesive layer 140 of FIG. 1B, an area of the grooves 143 is approximately 4% to 10% of a total area of the adhesive layer 140 (4%≤a ratio of the groove area to the total area of the adhesive layer≤10%), but it is not limited thereto.

With reference to FIG. 1C again, in the local cross-sectional schematic view of the adhesive layer 140, a shape of each of the grooves 143 may be, for example, a triangle, and a cross section of each of the grooves 143 has an apex angle V. The apex angle V may be defined by a side wall 1431 and a side wall 1432 of each of the grooves 143. In this embodiment, an angle θ (i.e., an included angle between the side wall 1431 and the side wall 1432) of the apex angle V may be, for example, 60 degrees to 110 degrees (60 degrees≤apex angle≤110 degrees), and in this way, the grooves 143 may provide a stable structure and may support the adhesive layer 140, but it is not limited thereto. When the angle θ is less than 60 degrees, the side wall 1431 and the side wall 1432 may be bonded together. When the angle θ is greater than 110 degrees, the grooves 143 may collapse. In some embodiments, a top shape of each of the grooves 143 may also be arcuate, polygonal, or irregular, but it is not limited thereto.

A plurality of first substrates 120 (2 are schematically shown in FIG. 1A as an example, but it is not limited thereto) are disposed on the support substrate 110, and the gap G is provided between two adjacent first substrates 120. In this embodiment, the small-sized first substrates 120 may be disposed on the large-sized driving substrate 160 or on the large-sized support substrate 110 in a spliced manner through the adhesive layers 140. Each of the first substrates 120 has a circuit layer (not shown). The circuit layer may include but not limited to elements of wires and/or transistors, and the circuit layer may be coupled to the semiconductor component 130. In this embodiment, each of the first substrates 120 may be, for example, a rigid substrate, a flexible substrate, or a combination of the foregoing. For instance, a material of each of the first substrates 120 may include glass, quartz, sapphire, a silicon wafer, a silicon carbide wafer, ceramics, polycarbonate, polymethylmethacrylate, siloxane, polyimid, polyethylene terephthalate, other suitable substrate materials, or a combination of the foregoing, but it is not limited thereto. In some embodiments, each of the first substrates 120 may be bendable.

The semiconductor element 130 is disposed on the first substrates 120. In this embodiment, the semiconductor element 130 may be, for example, a light emitting diode, but it is not limited thereto. In some embodiments, the semiconductor element 130 may also be a semiconductor element such as a chip.

The protection layer 170 is disposed on the semiconductor element 130. The protection layer 170 may cover the semiconductor element 130 and the first substrates 120. In this embodiment, a material of the protection layer 170 may be, for example, polyethylene terephthalate or other suitable transparent materials, but it is not limited thereto.

Figure 4:
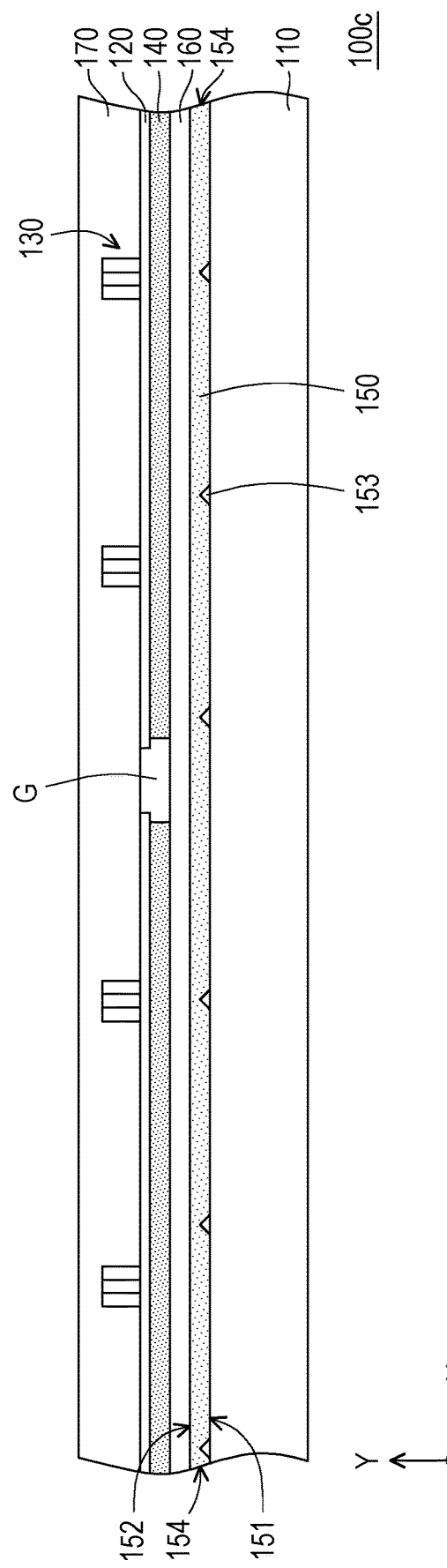
FIG. 4 is a local cross-sectional schematic view of an electronic device according to another embodiment of the disclosure.

In this embodiment, the grooves 143 are arranged to be disposed in the adhesive layers 140 between the driving substrate 160 and the first substrates 120, and the grooves 143 are disposed at the sides (i.e., the first sides 141) of the adhesive layers 140 facing the support substrate 110. However, the positions of the grooves 143 are not limited thereto in the disclosure, as long as the grooves disposed in the adhesive layers may extend to the edges of the adhesive layers. For instance, in some embodiments, the grooves may also be disposed at the sides (i.e., the second sides 142) (not shown) of the adhesive layers 140 facing the first substrates 120. In some embodiments, the grooves may also be disposed at both the first sides 141 and the second sides 142 (not shown) of the adhesive layers 140. In some embodiments, the grooves may also be disposed in the adhesive layer 150 located between the support substrate 110 and the driving substrate 160, as shown in FIG. 4. In some embodiments, the grooves may also be disposed in both the adhesive layers 140 and the adhesive layer 150 (not shown).

In some embodiments, when the support substrate is a circuit board or a circuit substrate with a circuit design, the driving substrate and the adhesive layers are not required to be additionally arranged. Herein, the first substrates may be directly bonded onto the support substrate (not shown) through the adhesive layers.

Other embodiments are described for illustration in the following. It should be noted that the reference numerals and part of the content in the previous embodiment are used in the following embodiments, in which identical reference numerals indicate identical or similar elements, and repeated description of the same technical content is omitted. Please refer to the descriptions of the previous embodiments for the omitted contents, which will not be repeated hereinafter.

Figure 2:
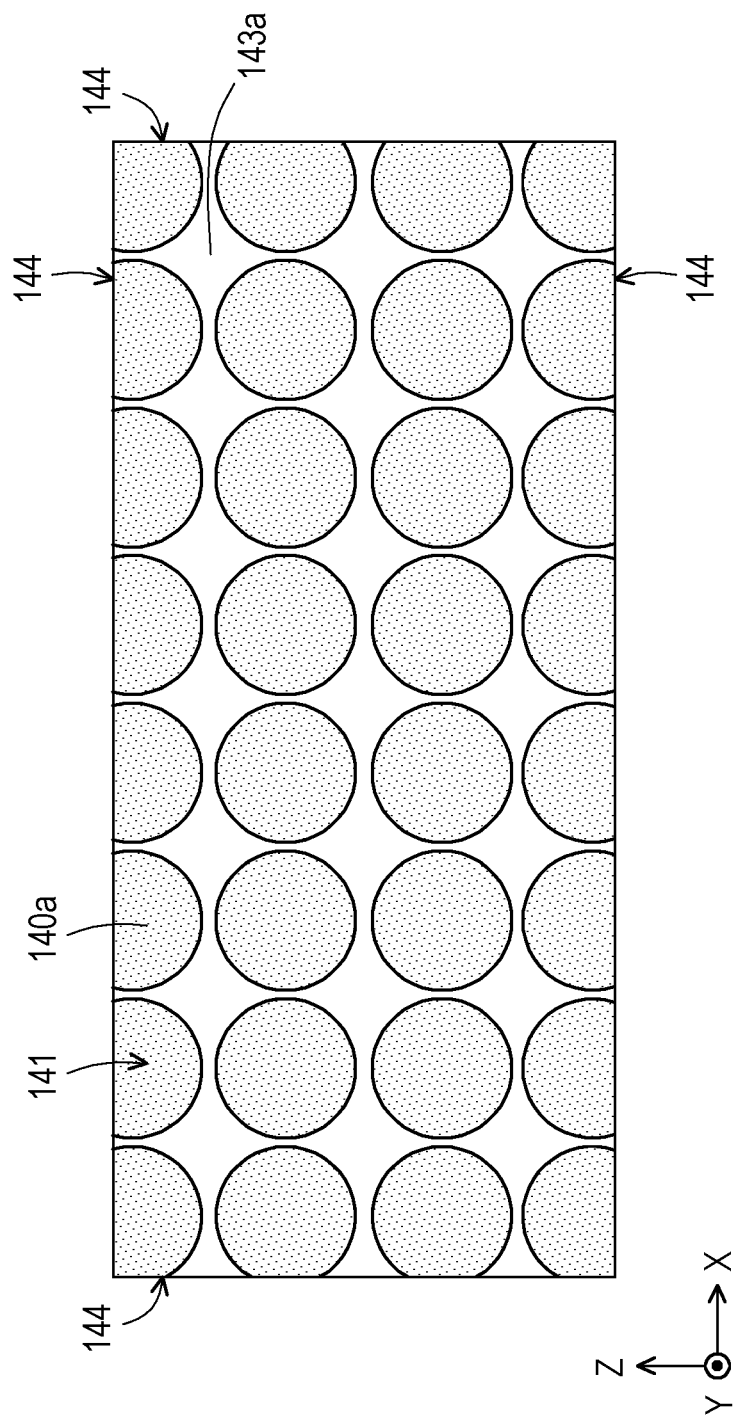
FIG. 2 is a bottom schematic view of an adhesive layer of an electronic device according to another embodiment of the disclosure.

FIG. 2 is a bottom schematic view of an adhesive layer of an electronic device according to another embodiment of the disclosure. With reference to FIG. 1B and FIG. 2 together, an adhesive layer 140a in this embodiment is similar to the adhesive layer 140 in FIG. 1B, but a difference therebetween lies in that: in the adhesive layer 140a in this embodiment, a plurality of grooves 143a may be substantially rhombus with arc-shaped edges, and a surface of the adhesive layer 140a at the first side 141 may be rounded.

To be specific, with reference to FIG. 2, in the bottom schematic view of the surface of the adhesive layer 140a, the grooves 143a may extend in the direction X and the direction Z to the four edges 144 of the adhesive layer 140a. The edges of the rhombus-shaped grooves 143a are concave arcs, and the rhombus-shaped grooves 143a are arranged in an array and are designed to be connected to each other. Therefore, the adhesive layer 140a at the first side 141 is divided into a plurality of circles, and fixed lines or repetitive patterns are thereby generated.

Figure 3:
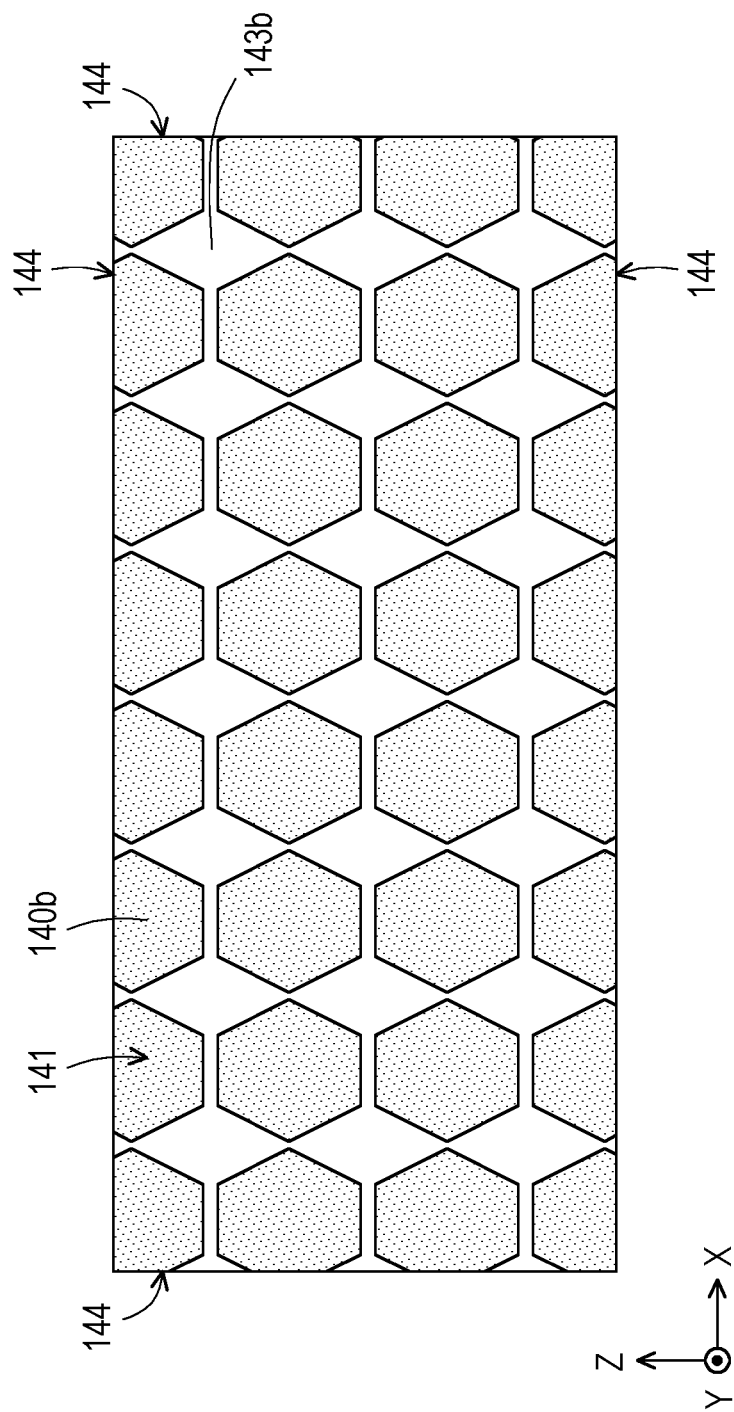
FIG. 3 is a bottom schematic view of an adhesive layer of an electronic device according to another embodiment of the disclosure.

FIG. 3 is a bottom schematic view of an adhesive layer of an electronic device according to another embodiment of the disclosure. With reference to FIG. 1B and FIG. 3 together, an adhesive layer 140b in this embodiment is similar to the adhesive layer 140 in FIG. 1B, but a difference therebetween lies in that: in the adhesive layer 140b in this embodiment, a plurality of grooves 143b may be substantially rhombus with straight edges, and a surface of the adhesive layer 140b at the first side 141 may be hexagonal.

To be specific, with reference to FIG. 3, in the bottom schematic view of the adhesive layer 140b, the grooves 143b may extend in the direction X and the direction Z to the four edges 144 of the adhesive layer 140b. The edges of the rhombus-shaped grooves 143b are straight lines, and the rhombus-shaped grooves 143b are arranged in an array and are designed to be connected to each other. Therefore, the adhesive layer 140b at the first side 141 is divided into a plurality of hexagons, and fixed lines or repetitive patterns are thereby generated.

FIG. 4 is a local cross-sectional schematic view of an electronic device according to another embodiment of the disclosure. With reference to FIG. 1A and FIG. 4 together, an electronic device 100c in this embodiment is similar to the electronic device 100 in FIG. 1A, but a difference therebetween lies in that: in the electronic device 100c in this embodiment, the adhesive layer 150 includes a plurality of grooves 153, and a thickness of adhesive layer 150 may be between 50 μm and 500 μm (50 μm≤the thickness of the adhesive layer≤500 μm).

To be specific, with reference to FIG. 4, the adhesive layer 150 is located between the support substrate 110 and the driving substrate 160, and the adhesive layer 150 has a first side 151 and a second side 152 opposite to each other. Herein, the first side 151 is the side of the adhesive layer 150 facing the support substrate 110. The second side 152 is the side of the adhesive layer 150 facing the first substrates 120 and is the side of the adhesive layer 150 facing the driving substrate 160.

In this embodiment, the grooves 153 are disposed in the adhesive layer 150. The grooves 153 are located at the side (i.e., the first side 151) of the adhesive layer 150 facing the support substrate 110, but it is not limited thereto. In some embodiments, the grooves may also be located at the side (i.e., the second side 152) (not shown) of the adhesive layer 150 facing the driving substrate 160. In some embodiments, the grooves may also be disposed at both the first side 151 and the second side 152 (not shown) of the adhesive layers 150. In some embodiments, the grooves may also be disposed in both the adhesive layers 140 and the adhesive layer 150 (not shown).

In this embodiment, the design of the grooves 153 is substantially the same as or similar to the design of the grooves 143 in FIG. 1A to FIG. 1C, FIG. 2, or FIG. 3, and description thereof is thus not repeated herein. Therefore, the grooves 153 may also be treated as exhaust channels, so that the air bubbles between the adhesive layer 150 and the support substrate 110 may pass through and be discharged along the grooves 153 towards edges 154 of the adhesive layer 150. In this way, when the substrates are bonded together, overall appearance flatness of the electronic device 100c may be improved.

Figure 5:
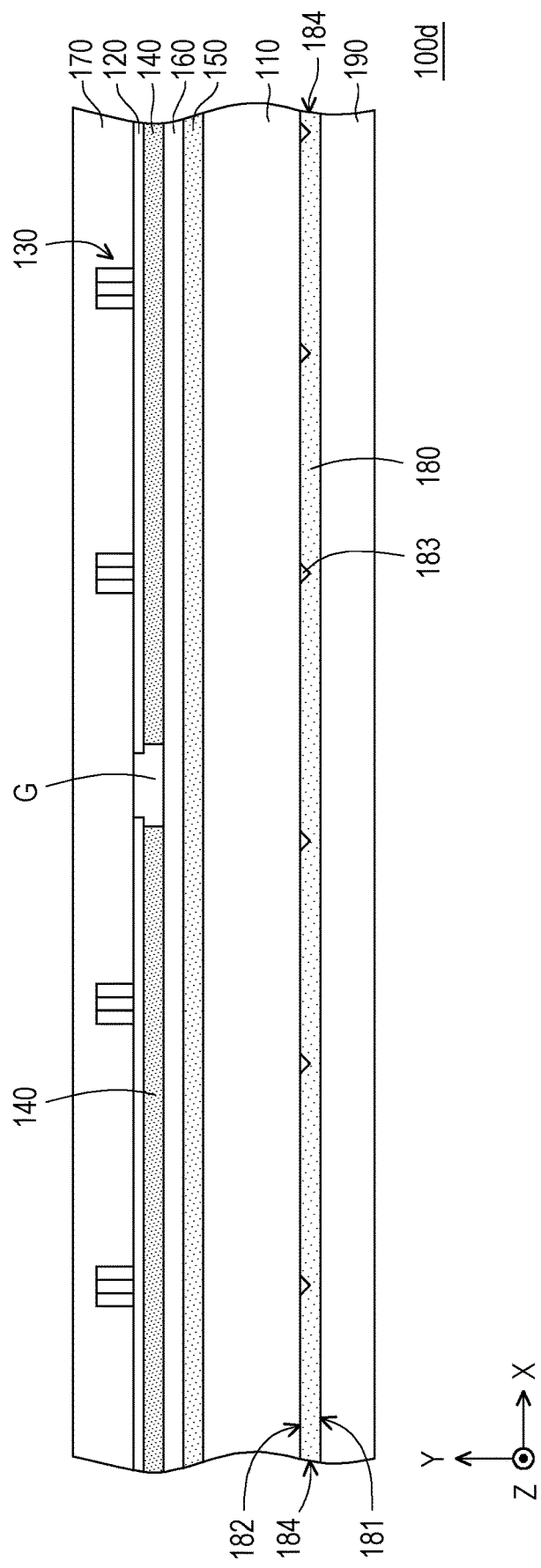
FIG. 5 is a local cross-sectional schematic view of an electronic device according to another embodiment of the disclosure.

FIG. 5 is a local cross-sectional schematic view of an electronic device according to another embodiment of the disclosure. With reference to FIG. 1A and FIG. 5 together, an electronic device 100e in this embodiment is similar to the electronic device 100 in FIG. 1A, but a difference therebetween lies in that: the electronic device 100d in this embodiment further includes an adhesive layer 180 and a decorative board 190. The adhesive layer 180 includes a plurality of grooves 183.

To be specific, with reference to FIG. 5, the decorative board 190 is disposed at the side of the support substrate 110 facing away from the first substrates 120 or the driving substrate 160. The driving substrate 160 and the decorative board 190 may be located on opposite sides of the support substrate 110. Herein, the decorative board 190 may be a rigid substrate, a flexible substrate, or a combination of the foregoing. For instance, a material of the decorative board 190 may include metal, polycarbonate, other suitable decorative board materials, or a combination of the foregoing, but it is not limited thereto.

The adhesive layer 180 is disposed between the decorative board 190 and the support substrate 110. The adhesive layer 180 has a first side 181 and a second side 182 opposite to each other. Herein, the first side 181 is the side of the adhesive layer 180 facing the decorative board 190. The second side 182 is the side of the adhesive layer 180 facing the support substrate 110, and a thickness of adhesive layer 180 may be between 50 μm and 500 μm (50 μm≤the thickness of the adhesive layer≤500 μm).

In this embodiment, the grooves 183 are located at the side (i.e., the second side 182) of the adhesive layer 180 facing the support substrate 110, but it is not limited thereto. In some embodiments, the grooves may also be located at the side (i.e., the first side 181) (not shown) of the adhesive layer 180 facing the decorative board 190. In some embodiments, the grooves may also be disposed at both the first side 181 and the second side 182 (not shown) of the adhesive layers 180. In some embodiments, the grooves may also be disposed in both the adhesive layers 140 and the adhesive layer 150 and/or the adhesive layer 180 (not shown).

In this embodiment, the design of the grooves 183 is substantially the same as or similar to the design of the grooves 143 in FIG. 1A to FIG. 1C, and description thereof is thus not repeated herein. Therefore, the grooves 183 may also be treated as exhaust channels, so that the air bubbles between the adhesive layer 180 and the support substrate 110 may pass through and be discharged along the grooves 183 towards edges 184 of the adhesive layer 180. In this way, when bonding is performed, overall appearance flatness of the electronic device 100d may be improved.

In view of the foregoing, in the electronic device provided by the embodiments of the disclosure, the adhesive layer has plural grooves (i.e., exhaust channels), so that air bubbles between the adhesive layer and other stacked layers (e.g., between the adhesive layer and the driving substrate) may be discharged towards the edges of the adhesive layer through the plurality of grooves. In this way, the problem of poor overall appearance flatness of the electronic device caused by air bubbles is improved. By adjusting the height range of the grooves, air bubbles may be discharged through the grooves, and the adhesive layer may be separated from the release layer without the risk of disconnection. Further, the angle of the apex angle of the each of the grooves is 60 degrees to 110 degrees, so that the grooves may provide a stable structure to support the adhesive layer.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. An electronic device, comprising:
a support substrate;
a first substrate, disposed on the support substrate;
a semiconductor element, disposed on the first substrate; and
an adhesive layer, disposed between the support substrate and the first substrate and comprising a plurality of grooves,
wherein the first substrate is disposed between the semiconductor element and the support substrate,
wherein a cross section of at least one of the plurality of the grooves only has one apex angle, and the one apex angle is 60 degrees to 110 degrees.

2. The electronic device according to claim 1, wherein the grooves are located on a side of the adhesive layer facing the first substrate.

3. The electronic device according to claim 1, wherein the grooves are located on a side of the adhesive layer facing the support substrate.

4. The electronic device according to claim 1, further comprising:
a driving substrate, coupled to the first substrate, wherein the adhesive layer is located between the driving substrate and the first substrate.

5. The electronic device according to claim 4, wherein the driving substrate and the first substrate are bendable.

6. The electronic device according to claim 4, wherein the driving substrate is located between the first substrate and the support substrate.

7. The electronic device according to claim 1, further comprising:
a driving substrate, coupled to the first substrate, wherein the adhesive layer is located between the support substrate and the driving substrate.

8. The electronic device according to claim 7, wherein the driving substrate is located between the first substrate and the support substrate.

9. The electronic device according to claim 1, wherein the semiconductor element is a light emitting diode.

10. The electronic device according to claim 1, further comprising:
a decorative board, disposed at a side of the support substrate facing away from the first substrate.

11. The electronic device according to claim 10, further comprising:
another adhesive layer, disposed between the decorative board and the support substrate and comprising a plurality of other grooves,
wherein the other grooves are located at a side of the another adhesive layer facing the support substrate.

12. The electronic device according to claim 1, wherein a height of each of the grooves is ⅓ to ½ of a thickness of the adhesive layer.

13. The electronic device according to claim 1, wherein a height of each of the grooves is between 3 μm and half a thickness of the adhesive layer.

14. The electronic device according to claim 1, wherein a thickness of the adhesive layer is 10 μm to 50 μm.

15. The electronic device according to claim 1, wherein the first substrate has a circuit layer, and the circuit layer is coupled to the semiconductor element.

16. The electronic device according to claim 1, further comprising:
a protection layer, covering the semiconductor element and the first substrate.

17. The electronic device according to claim 1, wherein the grooves are arranged in an alternating manner to form rhombus patterns.

18. The electronic device according to claim 1, wherein the grooves extend to an edge of the adhesive layer in a bottom schematic view of the adhesive layer.

19. The electronic device according to claim 1, wherein an area of the grooves is 4% to 10% of a total area of the adhesive layer in a bottom schematic view of the adhesive layer.

* * * * *